United States Patent
Lin

(10) Patent No.: US 10,983,429 B1
(45) Date of Patent: Apr. 20, 2021

(54) RETARGETING METHOD FOR OPTICAL PROXIMITY CORRECTION

(71) Applicant: Powerchip Semiconductor Manufacturing Corporation, Hsinchu (TW)

(72) Inventor: Chun-Liang Lin, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/995,821

(22) Filed: Aug. 18, 2020

(30) Foreign Application Priority Data

May 27, 2020 (TW) ................................ 109117643

(51) Int. Cl.
*G03F 1/36* (2012.01)
*G03F 1/70* (2012.01)

(52) U.S. Cl.
CPC . *G03F 1/36* (2013.01); *G03F 1/70* (2013.01)

(58) Field of Classification Search
CPC .......... G03F 1/36; G03F 1/70; G03F 7/70425; G03F 7/70441; G06F 30/398; H01J 2237/31769
See application file for complete search history.

(56) References Cited

U.S. PATENT DOCUMENTS

| | | | | |
|---|---|---|---|---|
| 6,539,521 B1 * | 3/2003 | Pierrat | ...................... | G03F 1/36 430/5 |
| 7,000,208 B2 * | 2/2006 | Zhang | ...................... | G03F 1/36 716/52 |
| 7,853,919 B2 * | 12/2010 | Huang | ...................... | G03F 7/705 716/55 |
| 8,930,858 B1 | 1/2015 | Kuo et al. | | |
| 8,984,449 B1 * | 3/2015 | Li | ......................... | G06F 30/398 716/52 |
| 9,443,055 B2 | 9/2016 | Hamouda et al. | | |
| 10,261,410 B2 * | 4/2019 | Zhang | ...................... | G03F 1/44 |
| 2002/0100004 A1 * | 7/2002 | Pierrat | ..................... | G03F 1/70 716/53 |
| 2003/0061583 A1 * | 3/2003 | Malhotra | .............. | G06F 30/398 716/52 |
| 2004/0006758 A1 * | 1/2004 | Aoki | ..................... | G06F 30/398 716/52 |
| 2004/0019869 A1 * | 1/2004 | Zhang | ...................... | G03F 1/36 716/52 |
| 2005/0055658 A1 * | 3/2005 | Mukherjee | ................ | G03F 1/36 716/52 |
| 2005/0153217 A1 * | 7/2005 | Izuha | .................. | G03F 7/70441 430/5 |
| 2005/0229131 A1 * | 10/2005 | Wu | .......................... | G03F 1/36 716/53 |

(Continued)

*Primary Examiner* — Nha T Nguyen

(74) *Attorney, Agent, or Firm* — JCIPRNET

(57) ABSTRACT

A retargeting method for optical proximity correction (OPC) is provided. The method includes: assigning evaluation points for defining profile of a layout pattern; identifying critical regions of the layout pattern that could result in limitation on the process window of the OPC; categorizing the critical regions based on geometries of the critical regions; obtaining movable ranges and address information of the evaluation points; and shifting the evaluation points according to the parameters obtained during the previous steps.

10 Claims, 7 Drawing Sheets

(56) References Cited

U.S. PATENT DOCUMENTS

| | | | |
|---|---|---|---|
| 2005/0229148 A1* | 10/2005 | Melvin | G03F 1/68 716/52 |
| 2005/0273733 A1* | 12/2005 | Lippincott | G03F 1/36 716/52 |
| 2006/0008135 A1* | 1/2006 | Nojima | G06T 7/001 382/145 |
| 2006/0085773 A1* | 4/2006 | Zhang | G03F 7/70441 716/52 |
| 2006/0236287 A1* | 10/2006 | Wu | G03F 1/36 716/53 |
| 2007/0050741 A1* | 3/2007 | Ogawa | G03F 1/36 716/52 |
| 2007/0220477 A1* | 9/2007 | Sagisaka | G03F 1/36 716/53 |
| 2009/0007053 A1* | 1/2009 | Kim | G03F 1/36 716/53 |
| 2009/0241087 A1* | 9/2009 | Zhang | G06F 30/398 716/55 |
| 2010/0030545 A1* | 2/2010 | Uno | G03F 1/68 703/13 |
| 2010/0062549 A1* | 3/2010 | Maeda | G03F 1/36 438/14 |
| 2010/0100865 A1* | 4/2010 | Lin | G03F 1/36 716/55 |
| 2010/0175041 A1* | 7/2010 | Krasnoperova | G03F 1/36 716/53 |
| 2010/0218156 A1* | 8/2010 | Pierrat | G06F 30/398 716/53 |
| 2011/0219342 A1* | 9/2011 | Socha | G06F 30/392 716/52 |
| 2012/0246601 A1* | 9/2012 | Kajiwara | G03F 1/36 716/52 |
| 2013/0131857 A1* | 5/2013 | Fan | G03F 7/705 700/121 |
| 2013/0239071 A1* | 9/2013 | Chang | G03F 7/70425 716/53 |
| 2013/0326434 A1* | 12/2013 | Feng | G03F 1/36 716/52 |
| 2014/0013286 A1* | 1/2014 | Hsuan | G03F 1/72 716/52 |
| 2014/0033143 A1* | 1/2014 | Kim | H01J 37/3026 716/53 |
| 2015/0067619 A1* | 3/2015 | Hsuan | G03F 7/70441 716/53 |
| 2016/0327856 A1* | 11/2016 | Jeong | G06F 30/398 |
| 2019/0212643 A1* | 7/2019 | Wan | G06F 30/00 |

* cited by examiner

RETARGETING METHOD FOR OPTICAL PROXIMITY CORRECTION

CROSS-REFERENCE TO RELATED APPLICATION

This application claims the priority benefit of Taiwan application serial no. 109117643, filed on May 27, 2020. The entirety of the above-mentioned patent application is hereby incorporated by reference herein and made a part of this specification.

BACKGROUND

Technical Field

The present disclosure relates to a method for improving a lithography process, and particularly, to a retargeting method used for optical proximity correction (OPC).

Description of Related Art

Along with development of semiconductor manufacturing, critical dimension of integrated circuit has been continuously scaled down. When the critical dimension of the integrated circuit approximates wavelength of light exposure of a lithography apparatus, an optical proximity effect (OPE) may be observed, and image transferred from reticle to photoresist may be distorted. In order to overcome such OPE, critical regions of the reticle that could result in image transfer errors may be designed for compensating the OPE by using optical proximity correction (OPC). Consequently, the image transfer errors can be reduced. However, when layout of the integrated circuit with small critical dimension becomes too complicated, effectiveness of the OPC is limited.

SUMMARY

The present disclosure provides a retargeting method for the OPC, in order to increase process window of the OPC.

In an aspect of the present disclosure, a retargeting method for OPC is provided. The method comprises: providing a layout pattern having lines, wherein the lines respectively extend along a first direction and a second direction intersected with the first direction, and respectively have a turning point; assigning evaluation points along boundaries of the lines; identifying critical regions of the lines, wherein each critical region comprises at least one of the turning points; categorizing the critical regions according to geometries of the critical regions; dividing each of the critical regions into retargeting sections, wherein at least one of the evaluation points is in each of the retargeting sections; scanning each of the retargeting sections in the critical regions, to obtain line widths of the lines at the retargeting sections, and to obtain sizes of open spaces respectively spanning outwardly from one of the lines at one of the corresponding retargeting sections to another one of the lines; and repositioning the evaluation points according to the line widths corresponding to the evaluation points, the sizes of the open spaces corresponding to the evaluation points, the geometries of the critical regions in which the evaluation points are located and locations of the retargeting sections in which the evaluation points are located.

In some embodiments, each of the critical regions is a region spanning from a vertex of the turning point of the corresponding line by a distance along the first direction and the second direction.

In some embodiments, the distance is proportional to a ratio of a wavelength of a light exposure of a lithography apparatus with respect to a numerical aperture of an optical system in the lithography apparatus.

In some embodiments, a method for categorizing the critical regions according to the geometries of the critical regions comprises: categorizing the critical regions according to turning angles at vertexes of the turning points in the critical regions.

In some embodiments, at least one of the critical regions comprises one of the turning points, the at least one of the critical regions is categorized as a type 1 critical region when the turning angle of the vertex at the one of the turning points is greater than 180° and less than 360°, and the at least one of the critical regions is categorized as a type 2 critical region when the turning angle of the vertex at the one of the turning points is greater than 0° and less than 180°.

In some embodiments, at least one of the critical regions comprises a first one and a second one of the turning points, the turning angle of the vertex at the first one of the turning points is greater than 180° and less than 360°, the turning angle of the vertex at the second one of the turning points is greater than 0° and less than 180°, and the at least one of the critical regions comprising the first and second ones of the turning points is categorized as a type 3 critical region.

In some embodiments, at least two of the retargeting sections are arranged in between the turning point and an end portion of each critical region along the first direction or the second direction.

In some embodiments, four of the retargeting sections are arranged in between the turning point and the end portion of each critical region along the first direction or the second direction.

In some embodiments, the repositioning of the evaluation points ensures that the repositioned evaluation points are not in contact with one another, or ensures that a spacing is in between adjacent ones of the repositioned evaluation points is greater than a pre-determined distance.

In some embodiments, at least one of the evaluation points shifts into the corresponding line during the repositioning of the evaluation points, and another one of the evaluation points shifts outwardly from the corresponding line during the repositioning of the evaluation points.

As above, a method for adjusting a layout pattern before performing OPC is provided in the present disclosure. Particularly, the layout pattern has two-dimensional portions that could put limitations on process window of the OPC. The method includes: assigning evaluation points for defining profile of the layout pattern; identifying critical regions of the layout pattern that could result in limitation on the process window of the OPC; categorizing the critical regions based on geometries of the critical regions; obtaining movable ranges and address information of the evaluation points; and shifting the evaluation points according to the parameters obtained during the previous steps. In this way, the layout pattern can be adjusted. Since influences on the process window of the OPC by the two-dimensional portions of the layout pattern are take into consideration for repositioning the evaluation points, designing a reticle for such layout pattern with assist of the OPC becomes easier. Therefore, transferring such layout pattern to a wafer by a lithography process can be more accurate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
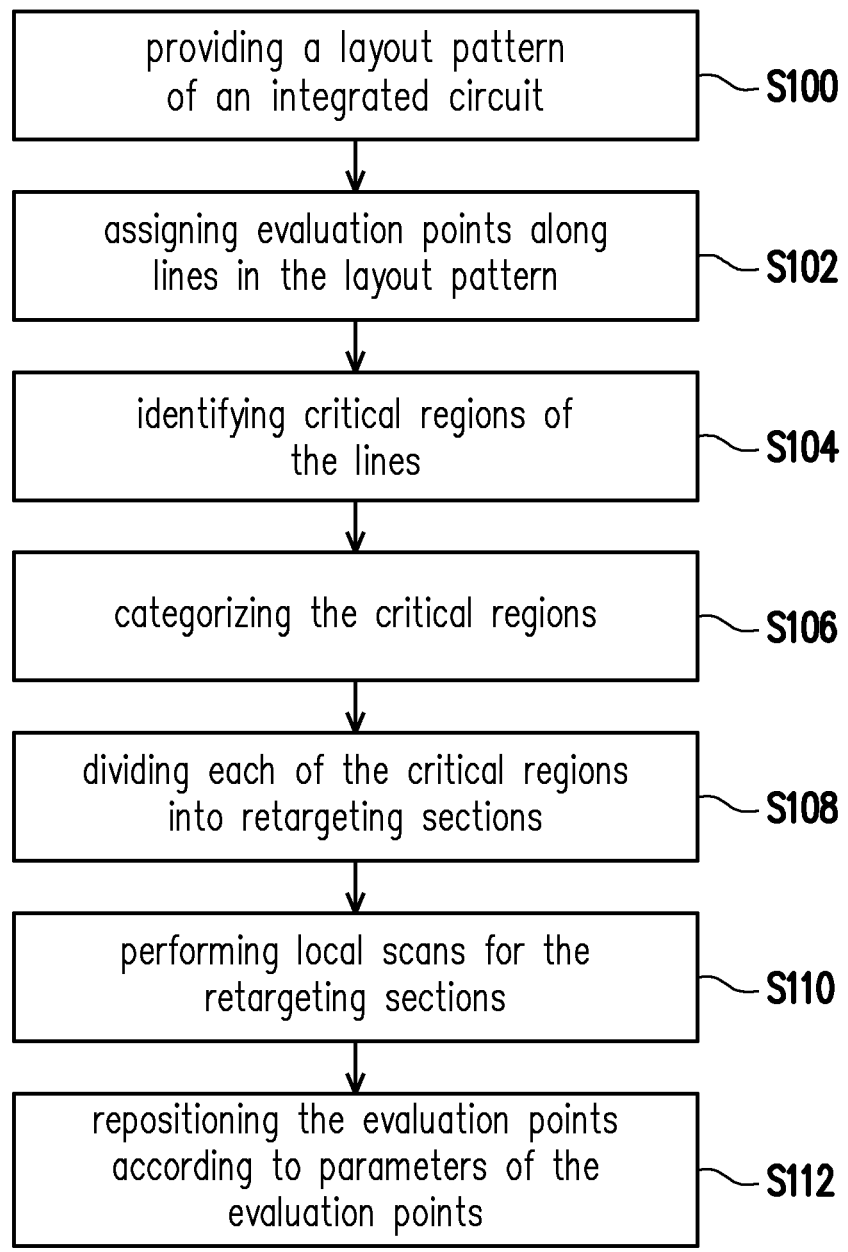
FIG. 1 is a flow diagram illustrating a retargeting method for OPC according to some embodiments of the present disclosure.

FIG. 1 is a flow diagram illustrating a retargeting method for OPC according to some embodiments of the present disclosure. FIG. 2A through FIG. 2H are schematic diagrams illustrating various stages of the retargeting method as shown in FIG. 1.

Figure 2A:
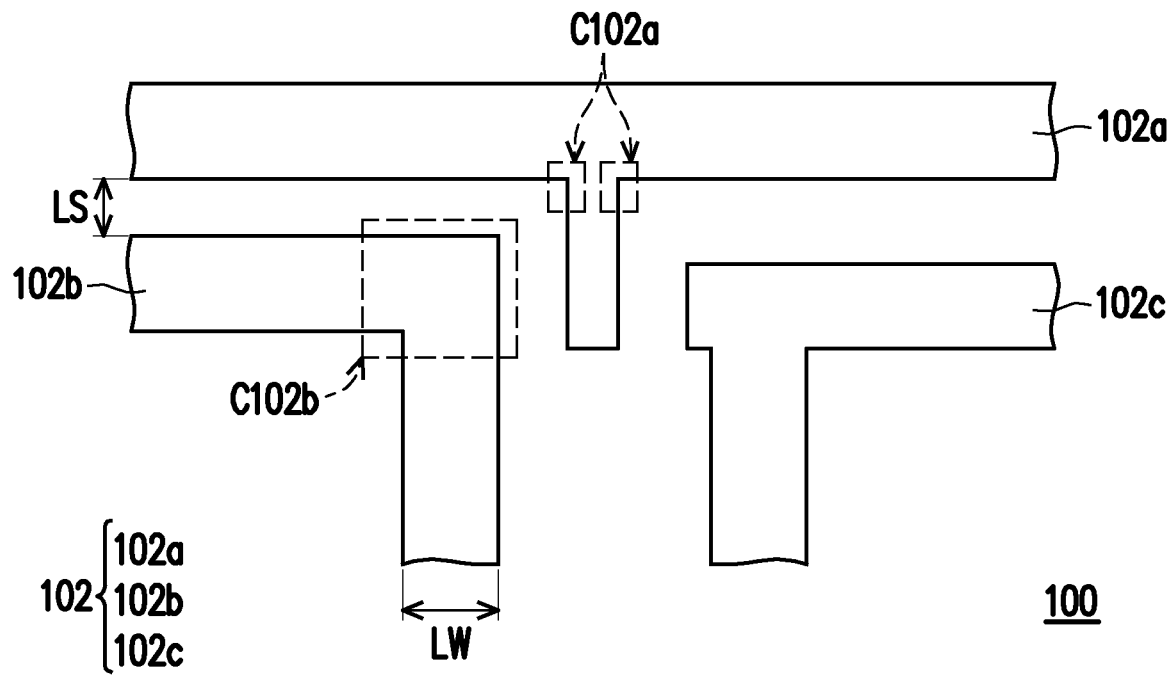
FIG. 2A through FIG. 2H are schematic diagrams illustrating various stages of the retargeting method as shown in FIG. 1.

Referring to FIG. 1 and FIG. 2A, step S100 is performed, and a layout pattern 100 of an integrated circuit is provided. In some embodiments, the layout pattern 100 may be provided as a graphic database system (GDS) format, but the present disclosure is not limited thereto. The layout pattern 100 is a design drawing, and a reticle is produced according to this layout pattern 100. A pattern on the reticle can be transferred to a photoresist coated on a wafer by a lithography process during semiconductor manufacturing. The OPC can be applied during design of the reticle, in order to compensate image transfer errors caused by diffraction or other reasons. In some embodiments, a critical dimension of the layout pattern 100 is very small, and the layout pattern 100 is complicated, such that the image transfer errors may not be effectively avoided even though the corresponding reticle is designed according to the OPC assisted by a rule of lithography friendly design (LFD). In certain cases, a corresponding reticle cannot be even produced due to violation of the LFD rule. In these embodiments, process window of the OPC is significantly shrunk. For instance, in these embodiments, lines 102 of the layout pattern 100 (e.g., a line 102a, a line 102b and a line 102c) may respectively have a line width LW from 35 nm to 95 nm, and a line spacing LS between adjacent lines 102 may range from 35 nm to 95 nm. Further, the lines 102 respectively extend along multiple directions, and respectively have at least one turn point along its extending direction. In other words, each line 102 is a two-dimensional pattern, rather than a one-dimensional pattern extending along a single direction. As an example, the line 102a is in a T-shape, and has two turning points C102a. On the other hand, the line 102b is in a L-shape, and has a turning point C102b. The following steps are performed to adjust the layout pattern 100, such that the adjusted layout pattern (e.g., the layout pattern 100' as shown in FIG. 2H) can be more lithography friendly, and the process window of the OPC can be increased.

Figure 2B:
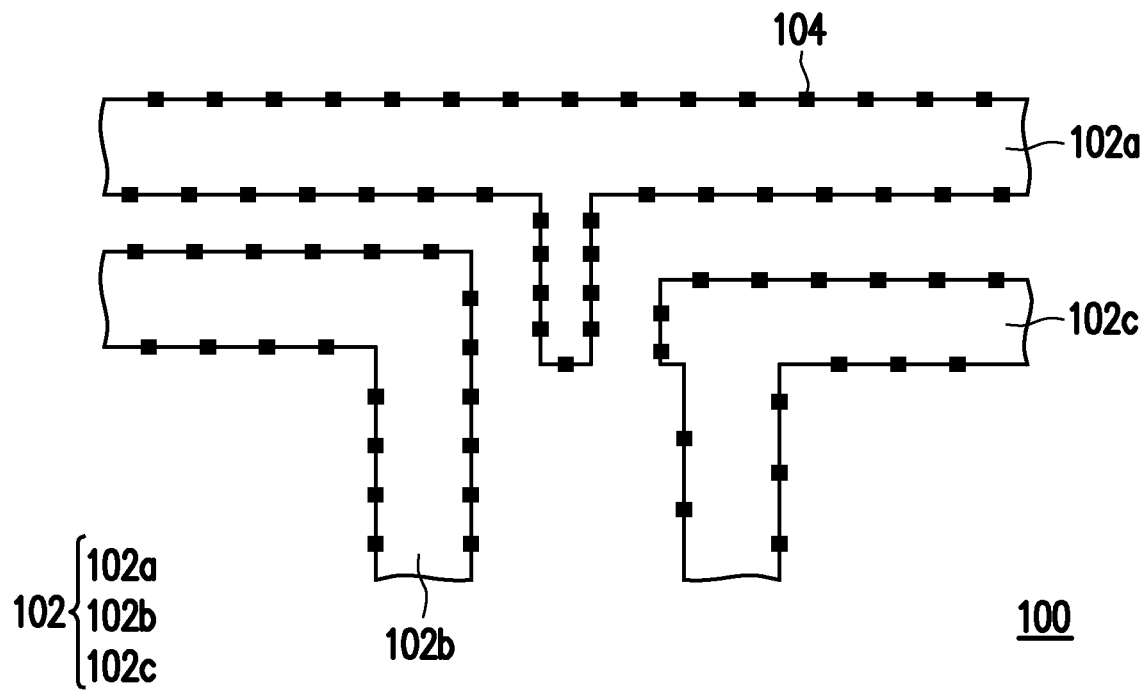

Referring to FIG. 1 and FIG. 2B, step S102 is performed, and multiple evaluation points 104 are assigned. The evaluation points 104 are assigned along boundaries of the lines 102, and are spaced apart from one another. Each evaluation point 104 can represent a portion of one of the lines 102, and profiles of the lines 102 can be simply indicated by the evaluation points 104. In other words, the lines 102 are defined by the evaluation points 104. The evaluation points 104 will be evaluated and selectively shifted before being functioned as inputs of the OPC. The selectively shifted evaluation points 104 define an adjusted layout pattern (e.g., the layout pattern 100' as shown in FIG. 2H). Performing the OPC based on the adjusted layout pattern may increase the process window of the OPC, and the method for selectively adjusting the evaluation points 104 may be referred as a retargeting process. It should be noted that, those skilled in the art may modify amount and pitch of the evaluation points 104 according to process requirements, the present disclosure is not limited thereto.

Figure 2C:
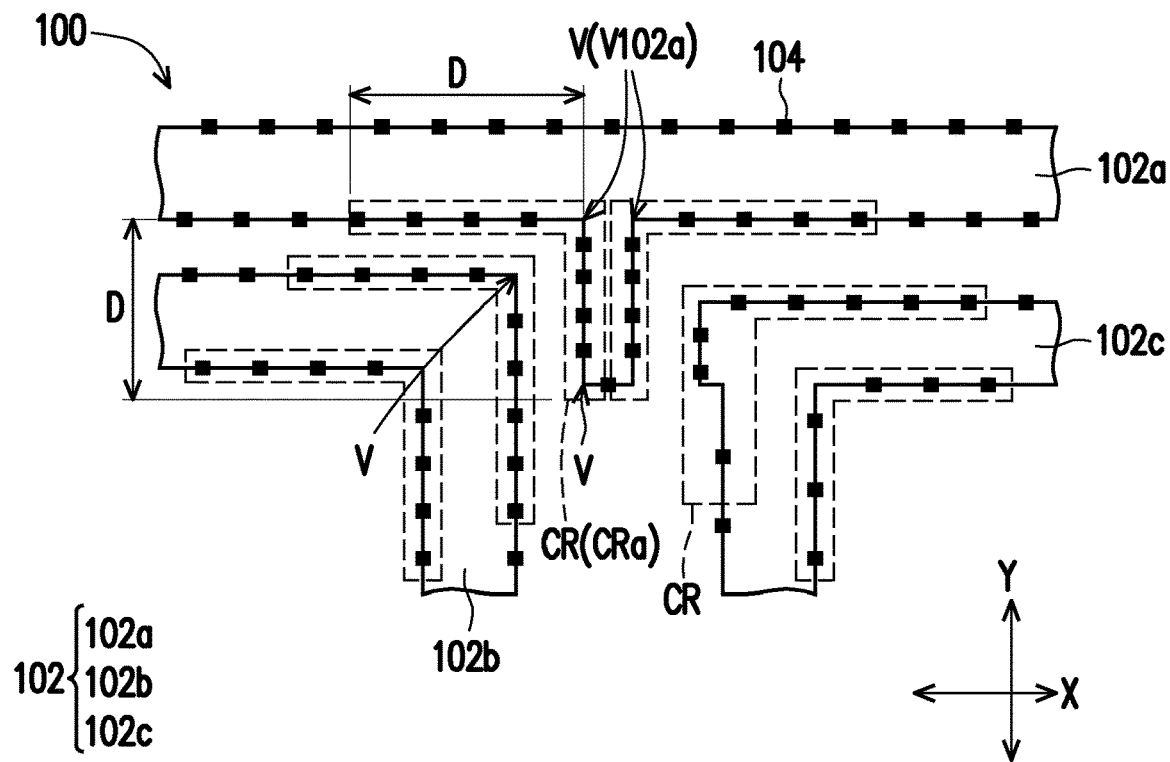

Referring to FIG. 1 and FIG. 2C, step S104 is performed, and critical regions CR of the lines 102 that could result in limitation on the process window of the OPC are identified. Those critical regions CR causing limitation on the process window of the OPC may otherwise be referred as lithography hot spots. In some embodiments, a method for identifying the critical regions CR includes identifying vertexes V of the lines 102. Each vertex V may be one of the turning points of the lines 102 as described with reference to FIG. 2A, or a corner of an end portion of one of the lines 102. Two-dimensional portions of the lines 102 can be identified by determining the vertexes V of the lines 102. These two-dimensional portions of the lines 102 may cause difficulties in accurately transferring the layout pattern 100 onto a wafer by a lithography process using a reticle produced according to the OPC assisted by the LFD rule, thus result in limitation on the process window of the OPC. Once the vertexes V are identified, regions respectively spanning from one of the vertexes V to an affected displacement D toward two opposite directions along the corresponding line 102 are determined. The affected displacement D is a length, and the regions spanning from the vertexes V by the affected displacements D define the critical regions CR. For instance, a critical region CRa of the line 102a spans from a vertex V102a at a turning point by the affected displacement D toward the direction X and the direction Y, and is appeared as a L-shape region. In some embodiments, the affected displacement D may be determined according to a wavelength of light exposure of a lithography apparatus and a numerical aperture of an optical system in the lithography apparatus. For instance, the affected displacement D may be determined according to equation (1):

$$D = \lambda/\text{NA} \times 1.32 \tag{1}$$

$\lambda$ is a wavelength of light exposure of a lithography apparatus, while NA is a numerical aperture of an optical system of the lithography apparatus. Taking a deep ultraviolet (DUV) lithography apparatus as an example, the wavelength of light exposure $\lambda$ may be 193 nm, while the numerical aperture NA may be, for example, 0.85. As a result, the affected displacement D may be about 300 nm. However, the afore-mentioned parameters may vary according to process apparatus, the present disclosure is not limited thereto.

On the other hand, regions of the lines 102 outside the critical regions CR may be one-dimensional. As compared to the two-dimensional portions, these one-dimensional regions put less limitation on the process window of the OPC. In some embodiments, the evaluation points 104 in these one-dimensional regions may be selectively shifted by the disclosed retargeting method. Alternatively, these one-dimensional regions may be input to the OPC assisted by the LFD rule, and the evaluation points 104 in these one-dimensional regions are not subjected to shifting (or referred as retargeting).

Figure 2D:
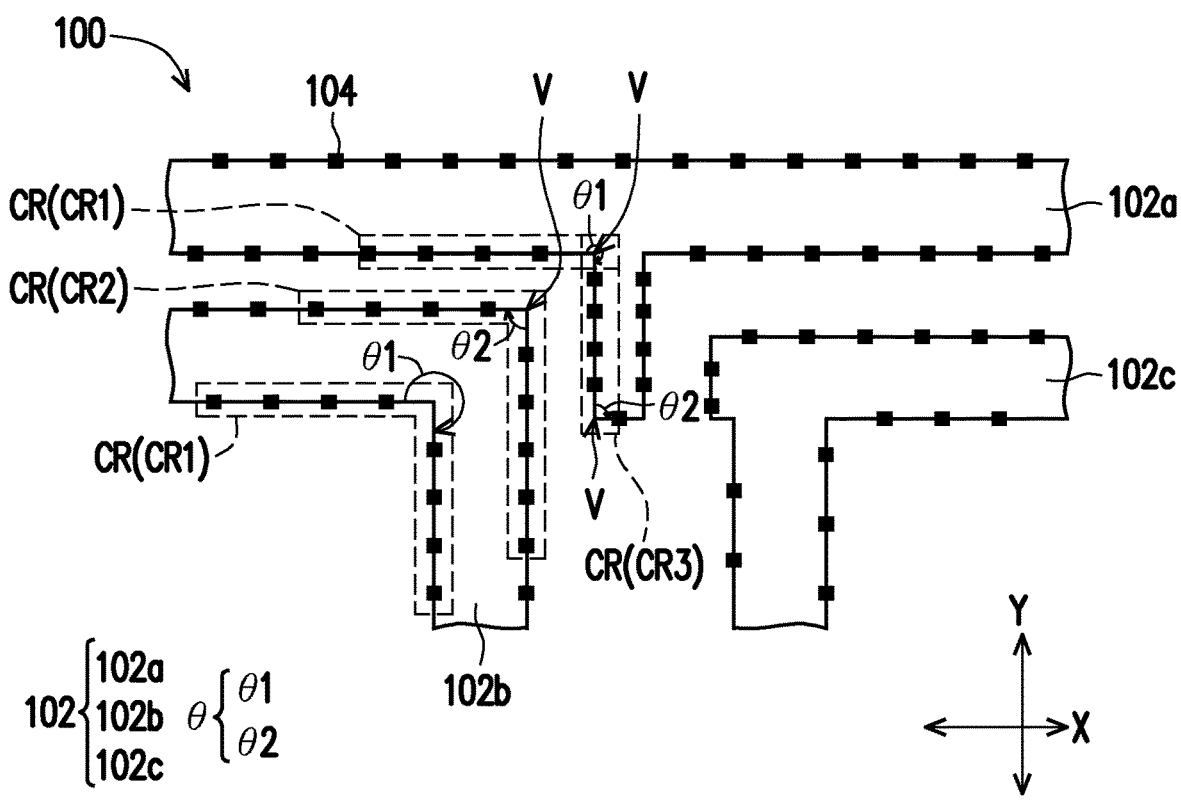

Referring to FIG. 1 and FIG. 2D, step S106 is performed, and the critical regions CR are categorized according to geometries of the critical regions CR. The critical regions CR with different geometries may affect the pattern transfer in different extents. In some embodiments, the critical regions CR may be categorized into type 1 critical regions CR1, type 2 critical regions CR2 and type 3 critical regions CR3 according to turning angles θ at the vertexes V of the lines 102. A critical region CR having the vertex V with a turning angle θ ranging from 180° to 360° (referred as a turning angle θ1) is categorized as the type 1 critical region CR1. A critical region CR having the vertex V with a turning angle θ ranging from 0° to 180° (referred as a turning angle θ2) is categorized as the type 2 critical region CR2. In addition, a critical region CR including both types of the vertexes V (i.e., the type of vertex V having the turning angle θ1 and the type of vertex V having the turning angle θ2) is categorized as the type 3 critical region CR3. In some embodiments, the type 1 critical region CR1 causes greater limitation on the process window of the OPC than the type 2 critical region CR2 does. On the other hand, influence on the process window of the OPC by the type 3 critical region CR3 may be greater than, less than or equal to the influence on the process window of the OPC by the type 1 critical region CR1/type 2 critical region CR2.

Figure 2E:
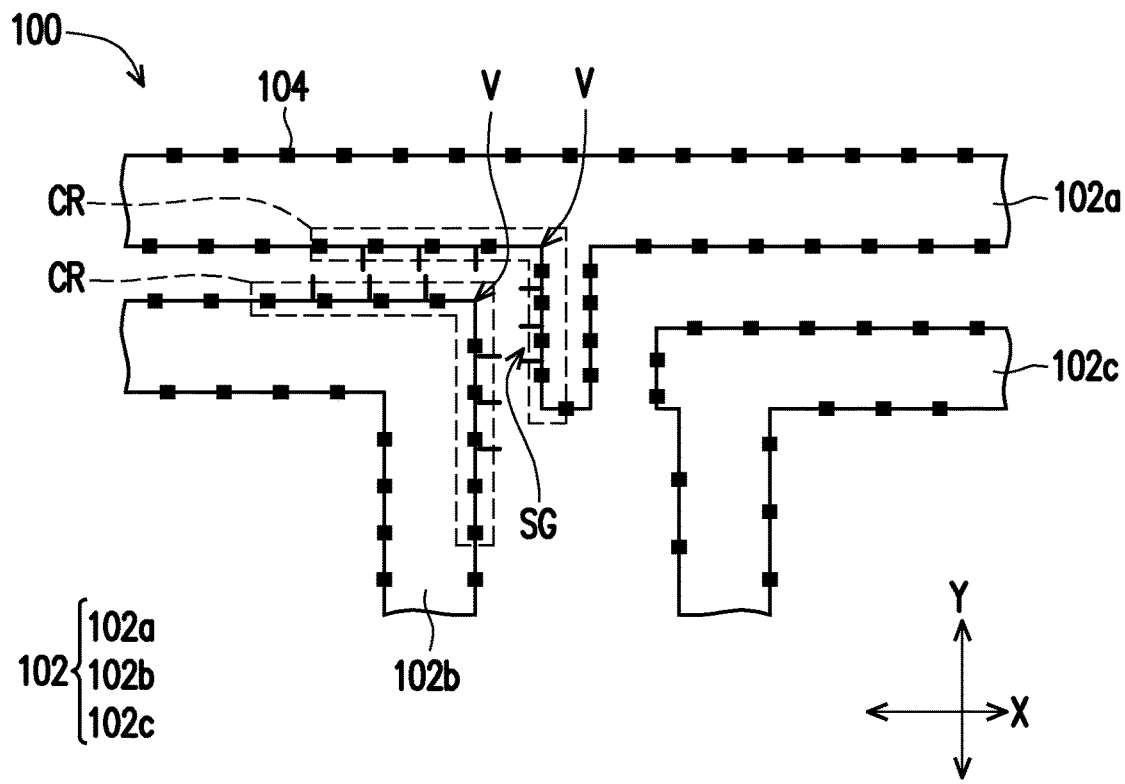

Referring to FIG. 1 and FIG. 2E, step S108 is performed, and each of the critical regions CR is divided into multiple retargeting sections SG. The retargeting sections SG respectively include at least one of the evaluation points 104. In addition, the retargeting sections SG may be numbered, thus may define a location (or referred as an address) of each evaluation point 104. It should be noted that, for conciseness, only two of the critical regions CR and the retargeting sections SG in these critical regions CR are labeled in FIG. 2E. In some embodiments, a method for dividing one of the critical regions CR into multiple retargeting sections SG includes dividing a portion of this critical region CR spanning from the vertex V to an end of this critical region CR into multiple retargeting sections SG (e.g., four retargeting sections SG). A length of each retargeting section SG may be adjusted, such that the subsequent shifting of the evaluation points 104 in adjacent retargeting sections SG may not be intervened with each other. In some embodiments, the length of each retargeting section SG may be shorter than a minimum design space of the layout pattern 100. For instance, the lengths of the retargeting sections SG may respectively range from 35 nm to 95 nm.

Figure 2F:
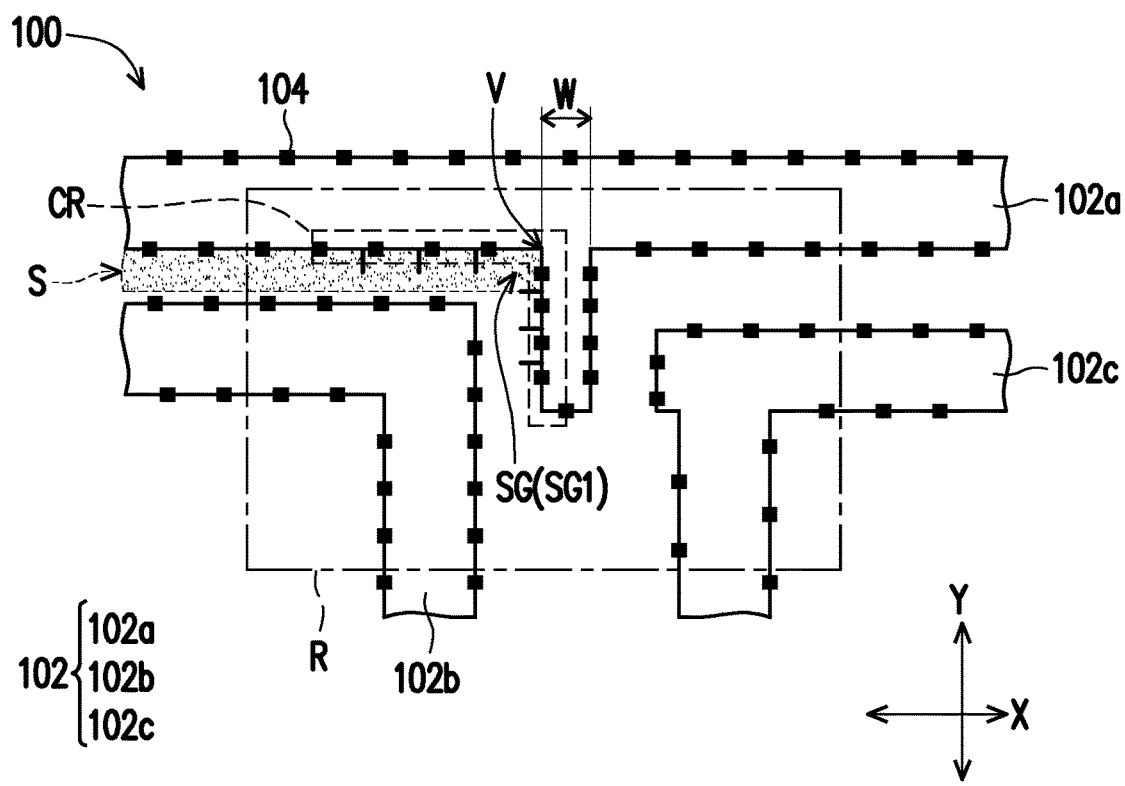

Referring to FIG. 1 and FIG. 2F, step S110 is performed, and local scans are performed for the retargeting sections SG, so as to determine a line width W and an open space S of each retargeting section SG. The line width W of one of the retargeting sections SG is defined as a width of the corresponding line 102 at this retargeting section SG, and the open space S of one of the retargeting sections SG is defined as a space spanning from a boundary of the corresponding line 102 at this retargeting section 102 to another line or pattern. By determining the line width W and the open space S of each retargeting section SG, a movable range of the evaluation point 104 in each retargeting section SG can be obtained. In other words, contact of the shifted evaluation points 104 with adjacent lines or patterns in the following step can be avoided, and ranges of the evaluation points 104 to be shifted into the lines 102 can be limited. It should be noted that, only one critical region CR of the line 102a is depicted in FIG. 2F, and one of the retargeting sections SG (labeled as a retargeting section SG1) in such critical region CR is used for illustrating the local scan in the step S110. Taking the retargeting section SG1 shown in FIG. 2F as an example, the line width W is a width of a portion of the line 102a extending along the direction Y, while the open space S is defined as a space spanning from the retargeting section SG1 of the line 102a to another line or pattern along the direction X.

Figure 2G:
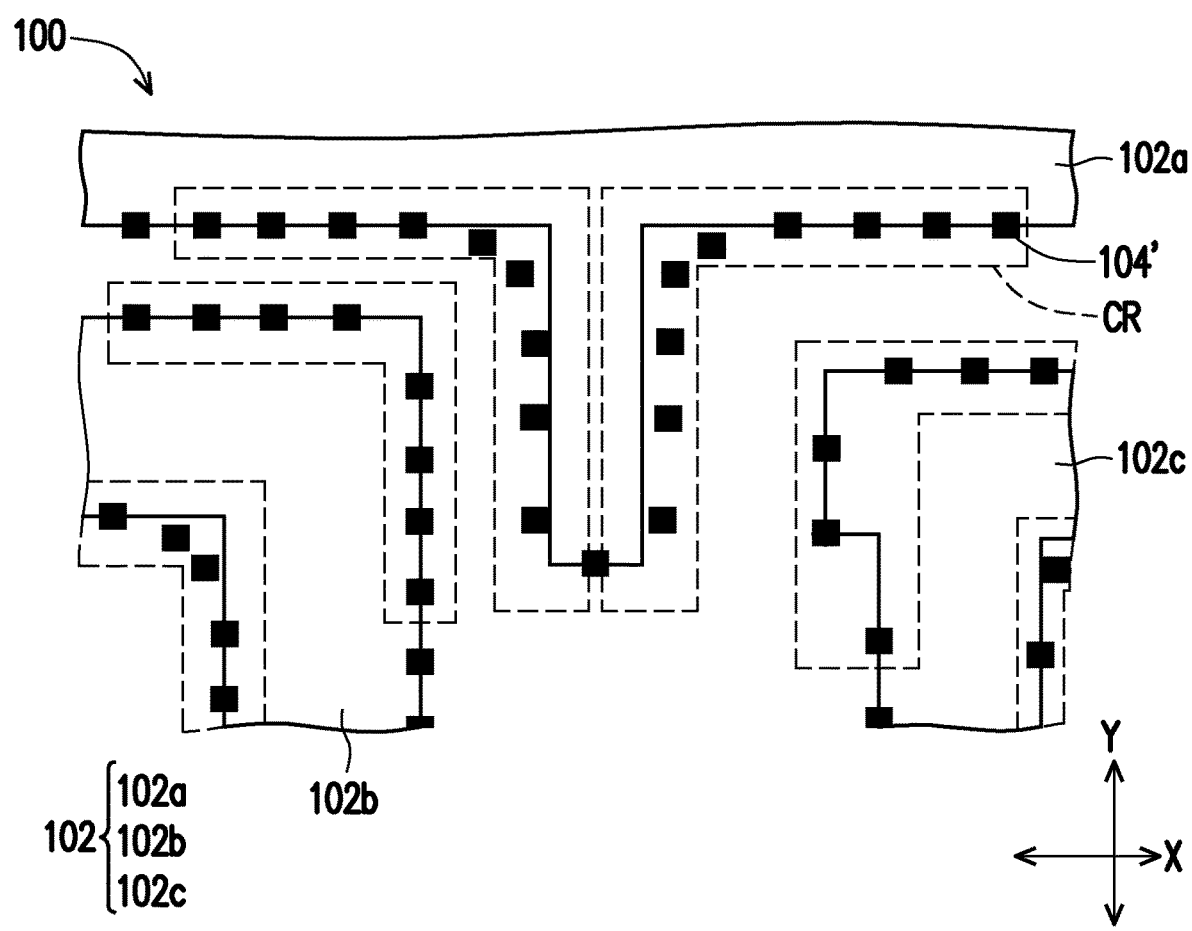
Figure 2H:
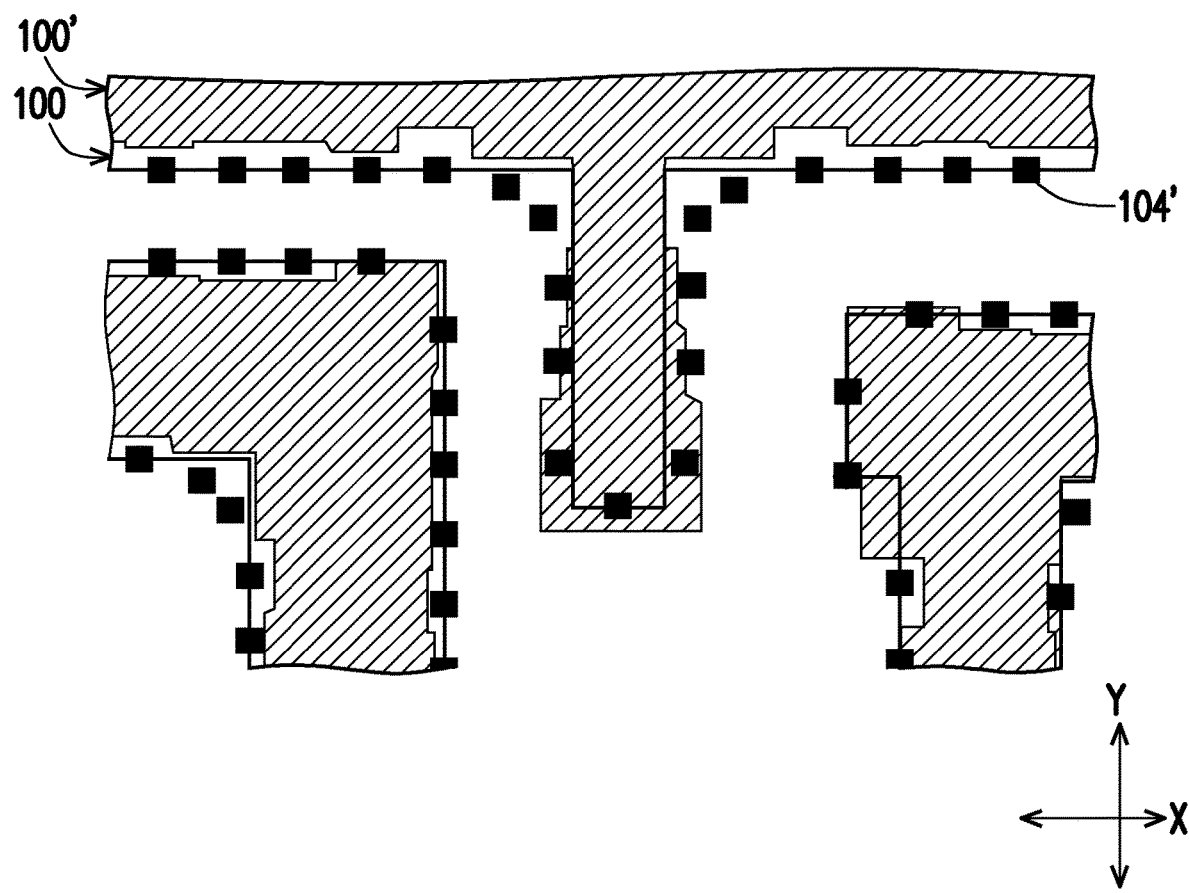

Referring to FIG. 1, FIG. 2G and FIG. 2H, step S112 is performed, and the evaluation points 104 are shifted according to the parameters of the evaluation points 104. In other words, the evaluation points 104 are repositioned in the step S112. The repositioned evaluation points are referred as evaluation points 104' in the present disclosure. As shown in FIG. 2G, at least some of the evaluation points 104' are offset from the boundaries of the lines 102, and are shifted outwardly from the lines 102 or shifted into the lines 102 as compared to the original evaluation points 104. By repositioning the evaluation points 104 representing the original layout pattern 100, the layout pattern 100 may be regarded as being changed to a new layout pattern 100' (as shown in FIG. 2H). It should be noted that, FIG. 2G and FIG. 2H illustrate the repositioning of the evaluation points 104 in a region R shown in FIG. 2F. In some embodiments, parameters on which shifting each evaluation point 104 is dependent include: the line width W of the retargeting section SG in which each evaluation point 104 is located (as described with reference to FIG. 2F); the open space S corresponding to the retargeting section SG in which each evaluation point 104 is located (as described with reference to FIG. 2F), the geometry of the critical region CR in which each evaluation point 104 is located (i.e., the types of the critical region CR as described with reference to FIG. 2D) and the address of each evaluation point 104 (as described with reference to FIG. 2E). A general equation of the offset of the evaluation points 104 with respect to variables representing the aforementioned parameters may be sorted out by statistical technique. The variables of the general equation can be substituted with the parameters of each evaluation point (e.g., the evaluation point 104) in a critical region corresponding to an original layout pattern (e.g., the layout pattern 100), such that offsets of the evaluation points can be determined. In some embodiments, in addition to calculating the offsets of the evaluation points 104, a maximum offset for each evaluation point 104 can be set, so as to prevent the shifted evaluation points 104' from being in contact with one another.

On the other hand, in some embodiments, evaluation points in the one-dimensional regions of the lines 102 (i.e., the regions outside the critical regions CR) can be adjusted according to the retargeting process of the present disclosure, except that the parameter regarding the geometry of the corresponding critical region CR (i.e., the type of the critical region CR) may be ignored. Alternatively, the parameter of an evaluation point 104 in a one-dimensional region regarding geometry of this evaluation point 104 may be set as a value different from values indicating the types 1, 2 and 3 critical regions (e.g., the type 1 critical region CR1, the type 2 critical region CR2 and the type 3 critical region CR3 as described with reference to FIG. 2D). In addition, the line width W of an evaluation point 104 in a one-dimensional region may be defined as a width of the corresponding line 102 at this evaluation point 104, and the open space S of an evaluation point 104 in a one-dimensional region may be defined as a space spanning from a boundary of the corresponding line 102 at this evaluation point 104 to another line or pattern. In alternative embodiments, the evaluation points 104 in the one-dimensional regions may not be shifted. In other words, in these alternative embodiments, the evaluation points 104' are overlapped with the original evaluation points 104.

Referring to FIG. 2E, FIG. 2G and FIG. 2H, in some embodiments, adjustment of the layout pattern 100 by repositioning the evaluation points 104 is performed for each retargeting section SG (as shown in FIG. 2G). In other words, the offsets of the evaluation points 104 in the same retargeting section SG (as shown in FIG. 2E) may be identical with one another. On the other hand, the offsets of the evaluation points 104 in different retargeting sections SG may be identical with or different from each other. As such, a boundary of the adjusted layout pattern 100' in each retargeting section SG may be smooth, and may have a step at an interface between adjacent retargeting sections SG. In this way, the adjusted layout pattern 100' may have a step profile.

Up to here, the retargeting method according to some embodiments of the present disclosure is complete. In some embodiments, the retargeting method may be performed by a processor (e.g., a computer). After such retargeting process, the adjusted layout pattern 100' may be input to the OPC, and used for designing a reticle. Thereafter, a lithography process (or a lithography process and an etching process) may be performed by using this reticle, to form a pattern corresponding to the original layout pattern 100 on a wafer.

Figure 3:
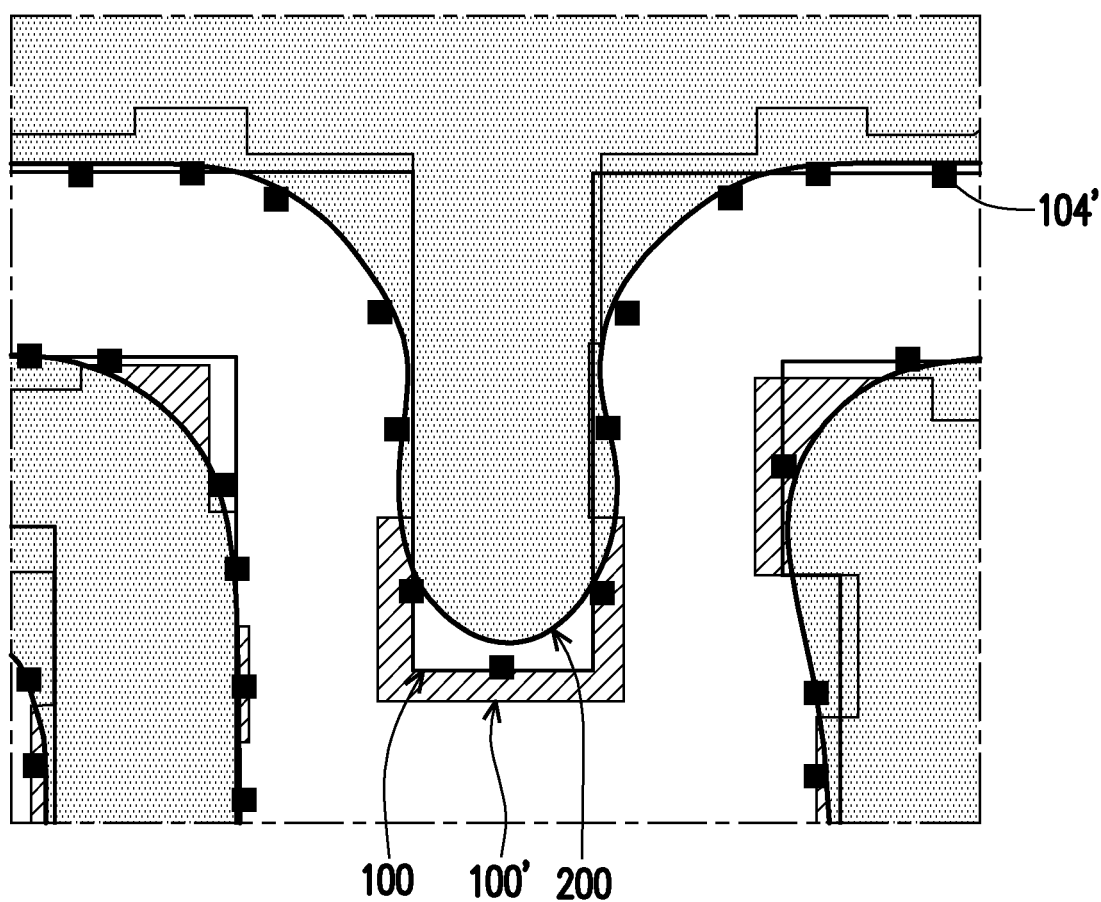
FIG. 3 illustrates the original layout pattern, the layout pattern being adjusted by the retargeting method and a pattern formed on a wafer based on the adjusted layout pattern, according to some embodiments of the present disclosure.

FIG. 3 illustrates the original layout pattern 100, the layout pattern 100' being adjusted by the retargeting method and a pattern 200 formed on a wafer based on the adjusted layout pattern 100', according to some embodiments of the present disclosure.

Referring to FIG. 3, even though the layout pattern 100 has two-dimensional regions and small dimensions (as described with reference to FIG. 2A), the process window of the OPC can be improved by adjusting the layout pattern 100 using the retargeting method, and a reticle corresponding to the original layout pattern 100 can be successfully fabricated. The pattern 200 shown in FIG. 3 schematically depicts a pattern formed on a wafer by performing a lithography process (or a lithography process and an etching process) using the afore-mentioned reticle. For instance, the pattern 200 is a metal pattern, such as a portion of metal lines in a layer of interconnections. However, those skilled in the art may apply the retargeting method for fabricating other structures on the wafer according to process requirements, the present disclosure is not limited thereto. In some embodiments, the boundary of the pattern 200 on the wafer is approximately along the evaluation points 104'. Further, as compared to the step profile of the layout pattern 100', the pattern 200 on the wafer may have a smooth profile.

As above, a method for adjusting a layout pattern before performing OPC is provided in the present disclosure. Particularly, the layout pattern has two-dimensional portions that could put limitations on process window of the OPC. The method includes: assigning evaluation points for defining profile of the layout pattern; identifying critical regions of the layout pattern that could result in limitation on the process window of the OPC; categorizing the critical regions based on geometries of the critical regions; obtaining movable ranges and address information of the evaluation points; and shifting the evaluation points according to the parameters obtained during the previous steps. In this way, the layout pattern can be adjusted. Since influences on the process window of the OPC by the two-dimensional portions of the layout pattern are take into consideration for repositioning the evaluation points, designing a reticle for such layout pattern with assist of the OPC becomes easier. Therefore, transferring such layout pattern to a wafer by a lithography process can be more accurate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A retargeting method for optical proximity correction, comprising:
providing a layout pattern having lines, wherein the lines respectively extend along a first direction and a second direction intersected with the first direction, and respectively have a turning point;
assigning evaluation points along boundaries of the lines;
identifying critical regions of the lines, wherein each critical region comprises at least one of the turning points, and portions of each critical region extending along the first and second directions meet at the at least one of the turning points;
categorizing the critical regions according to geometries of the critical regions;
dividing each of the critical regions into retargeting sections, wherein at least one of the evaluation points is in each of the retargeting sections, and a length of each retargeting section is shorter than a minimum design space of the layout pattern;
scanning each of the retargeting sections in the critical regions, to obtain line widths of the lines at the retargeting sections, and to obtain sizes of open spaces respectively spanning outwardly from one of the lines at one of the corresponding retargeting sections to another one of the lines; and
repositioning the evaluation points according to the line widths corresponding to the evaluation points, the sizes of the open spaces corresponding to the evaluation points, the geometries of the critical regions in which the evaluation points are located and locations of the retargeting sections in which the evaluation points are located.

2. The retargeting method for optical proximity correction according to claim 1, wherein each of the critical regions is a region spanning from a vertex of the turning point of the corresponding line by a distance along the first direction and the second direction.

3. The retargeting method for optical proximity correction according to claim 2, wherein the distance is proportional to a ratio of a wavelength of a light exposure of a lithography apparatus with respect to a numerical aperture of an optical system in the lithography apparatus.

4. The retargeting method for optical proximity correction according to claim 1, wherein a method for categorizing the critical regions according to the geometries of the critical regions comprises: categorizing the critical regions according to turning angles at vertexes of the turning points in the critical regions.

5. The retargeting method for optical proximity correction according to claim 4, wherein at least one of the critical regions comprises one of the turning points, the at least one of the critical regions is categorized as a type 1 critical region when the turning angle of the vertex at the one of the turning points is greater than 180° and less than 360°, and the at least one of the critical regions is categorized as a type 2 critical region when the turning angle of the vertex at the one of the turning points is greater than 0° and less than 180°.

6. The retargeting method for optical proximity correction according to claim 4, wherein at least one of the critical regions comprises a first one and a second one of the turning points, the turning angle of the vertex at the first one of the turning points is greater than 180° and less than 360°, the turning angle of the vertex at the second one of the turning points is greater than 0° and less than 180°, and the at least one of the critical regions comprising the first and second ones of the turning points is categorized as a type 3 critical region.

7. The retargeting method for optical proximity correction according to claim 1, wherein at least two of the retargeting sections are arranged in between the turning point and an end portion of each critical region along the first direction or the second direction.

8. The retargeting method for optical proximity correction according to claim 7, wherein four of the retargeting sections are arranged in between the turning point and the end portion of each critical region along the first direction or the second direction.

9. The retargeting method for optical proximity correction according to claim 1, wherein the repositioning of the evaluation points ensures that the repositioned evaluation points are not in contact with one another, or ensures that a spacing is in between adjacent ones of the repositioned evaluation points is greater than a pre-determined distance.

10. The retargeting method for optical proximity correction according to claim 1, wherein at least one of the evaluation points shifts into the corresponding line during the repositioning of the evaluation points, and another one of the evaluation points shifts outwardly from the corresponding line during the repositioning of the evaluation points.

\* \* \* \* \*